United States Patent [19]

Kusano

[11] 4,364,044

[45] Dec. 14, 1982

[54] SEMICONDUCTOR SPEECH PATH SWITCH

[75] Inventor: Masaaki Kusano, Yokohama, Japan

[73] Assignee: Hitachi, Ltd., Tokyo, Japan

[21] Appl. No.: 32,019

[22] Filed: Apr. 20, 1979

[30] Foreign Application Priority Data

Apr. 21, 1978 [JP] Japan .................................. 53-46556

[51] Int. Cl.³ .............................................. H04Q 3/50
[52] U.S. Cl. ............................ 340/825.85; 29/577 R; 361/416
[58] Field of Search ............... 340/166 R; 29/577 IC, 29/577 R, 590, 831, 843, 846, 592; 361/416, 413, 397

[56] References Cited

U.S. PATENT DOCUMENTS

| | | | |
|---|---|---|---|
| 3,484,933 | 12/1969 | Hagon | 29/577 |
| 3,525,617 | 8/1970 | Bingham | 29/577 |
| 3,704,455 | 11/1972 | Scarbrough | 365/103 |
| 3,861,023 | 1/1975 | Bennett | 29/577 |
| 3,897,626 | 8/1975 | Beausoleil | 29/577 |
| 4,001,871 | 1/1977 | Tsunemitsu | 29/577 |
| 4,063,993 | 12/1977 | Burns | 29/846 |
| 4,068,215 | 1/1978 | Mukaemachi et al. | 340/166 R |
| 4,179,802 | 12/1979 | Joshi et al. | 29/843 |
| 4,197,428 | 4/1980 | Semur et al. | 340/166 R |

Primary Examiner—Donald J. Yusko

Attorney, Agent, or Firm—Antonelli, Terry & Wands

[57] ABSTRACT

In a semiconductor speech path at least a crosspoint element for forming a unitary matrix is formed on a semiconductor chip. The interconnections between the crosspoint elements and the matrix wirings are made on a ceramic wiring plate. By mounting a plurality of semiconductor chips on the ceramic wiring plate by face-down bonding, unitary matrix arrays are formed and at the same time the whole of a matrix array is formed.

A row wiring having first speech path wirings and first selection wirings and a column wiring having second speech path wirings and second selection path wirings are doubly layered on the semiconductor wiring plate, with the intervention of an insulating layer therebetween. The upper layer, except for a pedestal region, is covered with a ceramic insulating layer. Terminals for row and column wirings are arranged in dual-in-line fashion. The speech path terminals of each of the row and column wirings are symmetrically and oppositely disposed to each other. This is correspondingly applied for the selection path terminals. With such a construction, the need for the multi-layered wiring on the semiconductor chip is eliminated, and the manufacturing of chips is simplified. Also crosstalk among the row and column wiring paths on the ceramic wiring plate is lessened and the grid wiring is facilitated.

3 Claims, 8 Drawing Figures

SEMICONDUCTOR SPEECH PATH SWITCH

BACKGROUND OF THE INVENTION

1. Field of the Invention

The invention relates to a speech path switch used in a telephone exchange or the like and, more particularly, to a speech path switch fabricated in a semiconductor integrated circuit.

2. Description of the Prior Art

A speech path switch is generally used in a telephone exchange for coupling a subscriber with another subscriber. A conventional speech path switch uses a mechanical contact for the crosspoint. This mechanical type crosspoint encounters problems in miniaturizing the size of the exchange, reducing the weight and improving the reliability of the exchange. An integrated semiconductor speech path switch using semiconductor switching elements for the crosspoints had been developed with the view of overcoming the just-mentioned problems.

The semiconductor speech path switch for the telephone exchange must permit high voltage analog signals such as a bell signal and metering pulses to pass therethrough. For this, the integrated circuit elements must withstand extremely high voltage and current, thus needing large surface areas of the elements. The necessity of the bidirectional function results in increasing the number of elements used. Generally, the speech path is constructed by a two-wire balanced path, so that the number of terminals is increased.

Therefore, it is very difficult to manufacture a balanced two-wire, 8×8 matrix speech path switch usually used as a minimal matrix by the monolithic integrated circuit technology. Thus, such a minimal 8×8 matrix requires multi-chip packaging.

However, if the multi-chip packaging on a wiring substrate is employed, it is difficult to fabricate a matrix of 8×8 into one package in view of the number of chips, the number of package terminals, the size of a substrate, and the manner of wiring, sealing and the like. Therefore, in the past, a 4×4 matrix was constructed by one package and an 8×8 matrix must be formed on a large printed circuit board, as disclosed in U.S. Pat. No. 3,735,057.

Further, in constructing a grid during subsequent packaging operations by mounting a plurality of speech path switches on a printed circuit board, it must withstand a high voltage signal of 100 V or more, with low wiring resistance. This necessitates a relatively larger space for the speech path wiring on the printed circuit board, as compared with the switch handling signals of logical level. Particularly, it is impossible to dispose the speech path wiring between usual IC terminals (spaced by 2.54 mm, for example). For example, in the case of a speech path switch with a 200 V voltage withstand requirement, at least 2.9 mm is necessary for the space between the IC terminals.

SUMMARY OF THE INVENTION

Accordingly, an object of the present invention is to provide a semiconductor speech path switch with an m×n matrix construction which may be constructed by one package.

Another object of the invention is to provide a semiconductor speech path switch which facilitates a so-called grid construction in mounting the speech path switches on a printer circuit board taking account of the wiring for high voltage withstand.

According to the invention, there is provided a semiconductor speech path switch with a plurality of semiconductor chips each including a crosspoint element mounted on a wiring plate by face-down bonding, in which a speech path switch row having first speech path wirings and first selection path wirings and a speech path switch column having second switch path wirings and second speech path wirings are multi-layered on the wiring plate, with an intervention of an insulating layer therebetween so as to insulation-cross to each other. Pedestals for chip-connection are provided directly or through throughholes on each wiring, and speech path row and column terminals and selection path row and column terminals are adjacently disposed to each other on the respective opposite sides of the wiring board. These respective terminals are connected to said speech path wirings and said selection path wirings on the wiring board, a crosspoint element for forming at least one unitary matrix is formed on each semiconductor chip, and, by connecting the respective semiconductor chips to said chip-connection pedestals by the face-down bonding technique, the unitary matrix is formed while, at the same time, an m×n matrix is formed.

Other objects and features of the invention will be apparent from the following description taken in connection with the accompanying drawings.

DESCRIPTION OF THE PREFERRED EMBODIMENTS

Figure 1:
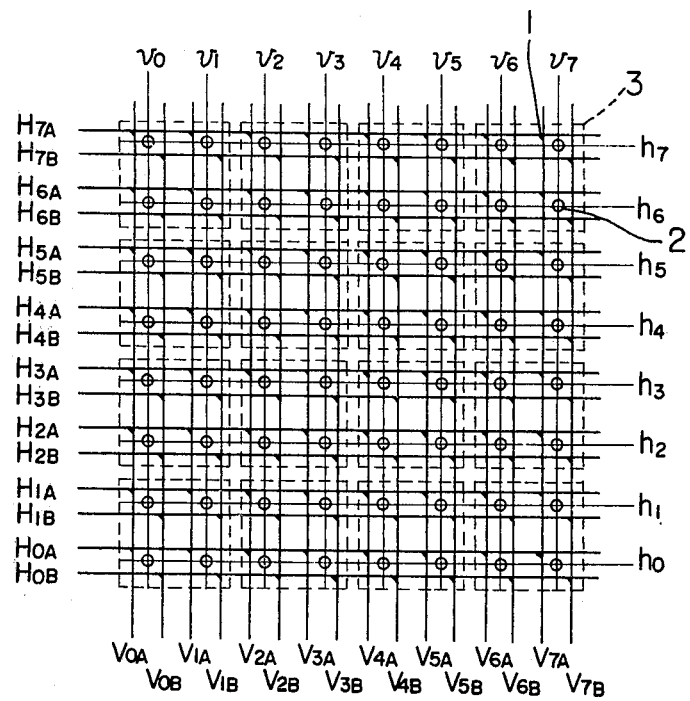
FIG. 1 shows a schematic wiring diagram of a speech path switch of 8×8 matrix construction according to the invention.

Reference is made to FIG. 1 illustrating a schematic wiring diagram of a semiconductor speech path switch arranged in an 8×8 matrix according to the invention. Semiconductor switching elements are used for the crosspoint contacts of the switch.

Figure 2:
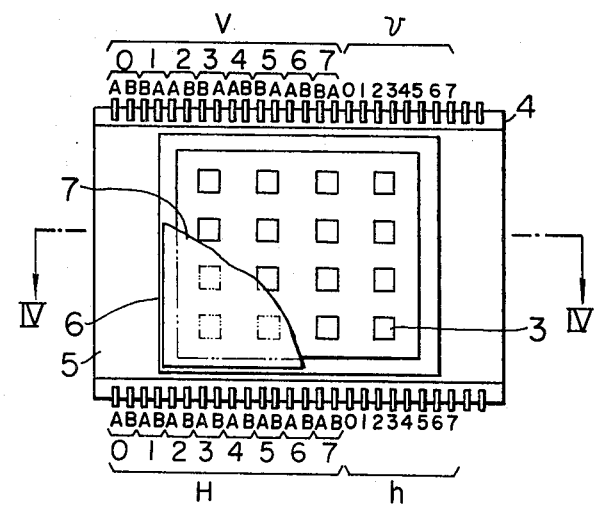
FIG. 2 shows a plan view of an embodiment of a semiconductor speech path switch according to the invention.
Figure 3:
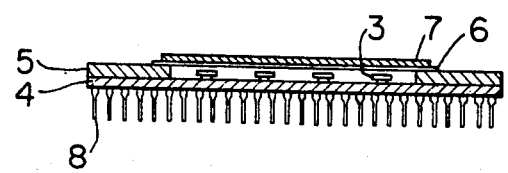
FIG. 3 shows a cross sectional view of the switch taken along line IV—IV in FIG. 2.

The semiconductor speech path switch is an 8×8 matrix with sets of two balanced wires which comprises speech paths as its columns with terminals V0A, V0B to V7A, V7B, speech paths as its rows with their terminals H0A, H0B to H7A, H7B, semiconductor switching elements 1 as their crosspoint switching contacts, crosspoint selection holding elements 2 (semiconductor switching elements 1 and crosspoint selection holding circuit elements 2 are here shown as ▲ and ○, respectively), and selection paths with their terminals h0 to h7, and v0 to v7. To avoid the complexity of the diagram, the speech paths and selection paths are not labelled with their symbols, though their terminals are marked with symbols. FIGS. 2 through 7 show an example of the semiconductor speech path embodying the present invention. Reference numeral 3 designates a semiconductor chip in which eight switching elements and four crosspoint selection holding circuits 2 are integrated as shown in the specific circuit diagram of FIG. 4 in order to form the $2 \times 2$ matrix with sets of two balanced wires surrounded by a dotted line square in FIG. 1. Each of these switching elements 1 is a bidirectional element, such as a bidirectional switch, comprising two thyristors which are semiconductors with high dielectric strength to permit passage of high analog signals such as a bell signal. Reference numeral 2 is a crosspoint selection holding circuit comprising a memory element M and a constant current driven circuit DR. Reference numeral 4 is a ceramic wiring plate for accommodating 16 semiconductor chips 3 which are described hereafter, to constitute a balanced two-wire $8 \times 8$ matrix speech path switch such as that shown in FIG. 1. Reference numeral 5 is a ceramic sheet for hermetic seal. Reference numeral 6 is a metalized layer. Numeral 7 is a cover for a hermetic seal, and only a part of which is shown in FIG. 2.

In these figures, V, H and v and h denote speech path terminals and selection path terminals, respectively. 0 to 7 and A and B indicate their terminal numbers (as V0A, V0B to V7A, V7B, H0A, H0B to H7A, H7B, v0 to v7, h0 to h7 in FIG. 1). Further, these terminals are located in the dual-in-line fashion on each of two parallel sides of the ceramic wiring plate 4. All of these speech path terminals are so arranged that they are symmetrically located relative to the center line of the ceramic plate 4. Similarly, all of the selection path terminals are symmetrically located relative to the center line of the ceramic plate. Ha′0, Hb′0, Ha′1, Hb′1, Va′0, Vb′0, Va′1, Vb′1, ha′0, ha′1, va′0, and va′1 are the electrodes to be soldered with connections to the pedestals on the wiring plate to be described later.

Figure 4:
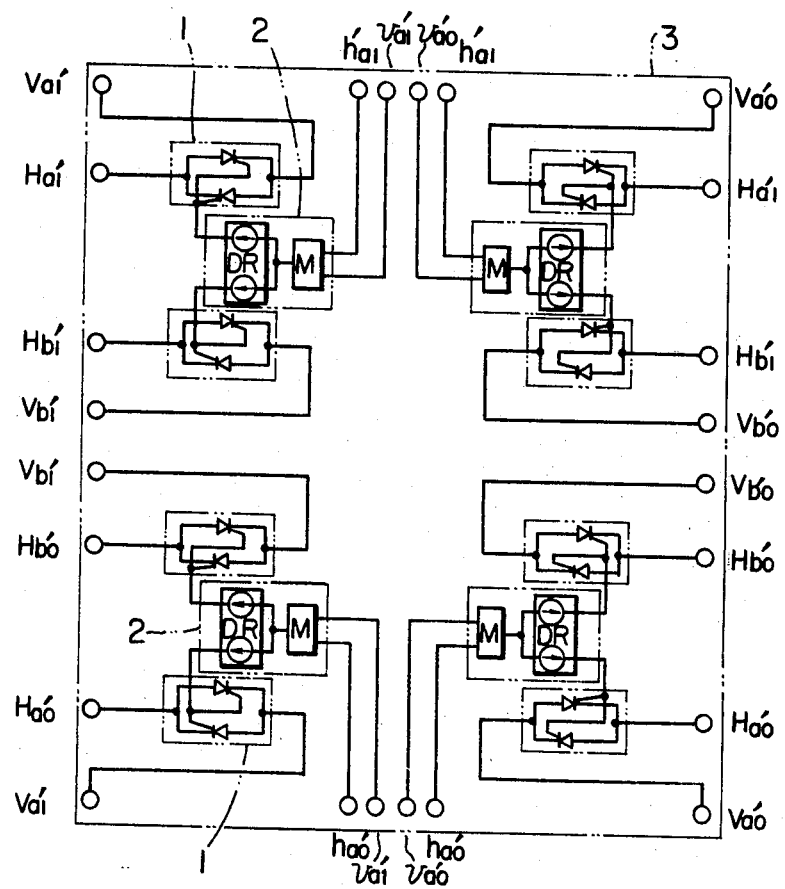
FIG. 4 shows an enlarged view of the semiconductor chip 3 shown in FIG. 2.
Figure 5:
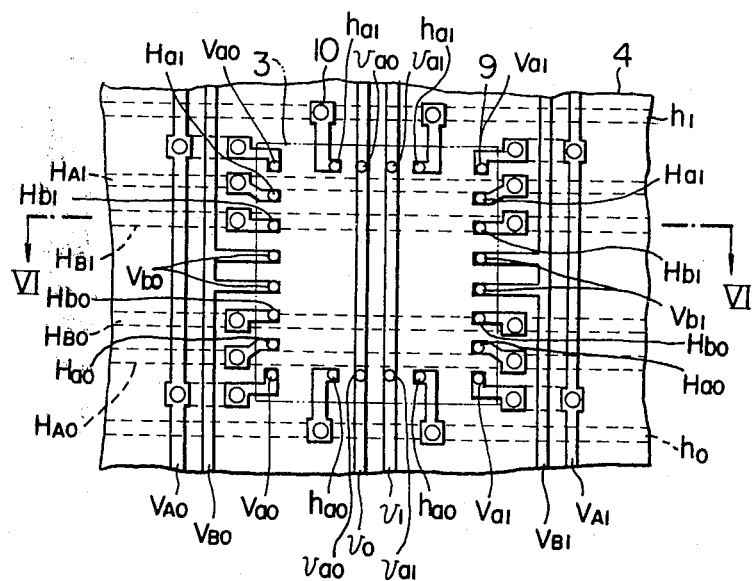
FIG. 5 shows a partial enlarged view of a wiring board 4 shown in FIG. 2.
Figure 6:
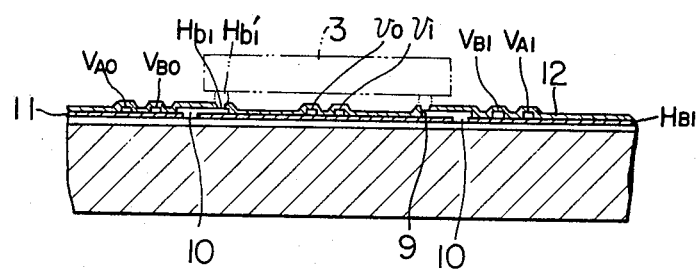
FIG. 6 shows a cross sectional view taken along line VI—VI in FIG. 5.

Returning again to FIG. 3, there is shown an IV—IV cross section of FIG. 2 to show that the semiconductor chips 3 are facedown-bonded to the ceramic wiring plate 4. A cover 7 is connected air-tight with a metalized layer 6 using a low melting point binder. FIG. 5 shows an enlarged view of a part of FIG. 2 showing the circuitry on one of the semiconductor chips 3 on the wiring plate 4. FIG. 6 shows the VI—VI cross section of FIG. 5. In FIG. 6, portions 9 shown with chain lines are pedestal conductors for connecting the chip 3, the details of which will be given below. The chip 3 shown in FIG. 6 comprises eight switching elements and four point selection holding circuits to form the $2 \times 2$ matrix with sets of two balanced wires as shown in FIG. 4. For easy understanding, FIG. 5 uses chain lines to denote the chip 8, omits the surface insulating layer on the ceramic wiring plate and uses broken lines to denote the circuit below the insulating layer. Numeral 10 denotes a throughhole. The ceramic plate has pairs of pedestals Ha0, Hb0, Ha1, Hb1, Va0, Vb0, Va1, Vb1, ha0, ha1, va0, and va1. Each pair of the pedestals are connected with circuits HA0, HB0, HA1, HB1, VA0, VB0, VB1, h0, h1, v0 and v1, on the ceramic plate to constitute a $2 \times 2$ unitary matrix.

The ceramic plate 4 is fabricated by first forming the H lines (HA0, HB0, HA1 and HB1 in FIG. 5) of speech paths and the h lines (h0 and h1) of selection paths as the first layer of conductor, secondly forming the insulating layer 11 with throughholes 10, and then forming the V lines (VA0, VB0, VA1 and VB1) of speech paths and the v lines (v0 and v1) of selection paths as the second layer of conductor or the insulation layer in such a manner that they are perpendicular to the H lines and h lines, and further forming the insulating layer 12 leaving only the pedestal portions 9 exposed. The wiring given above thus constitutes $2 \times 2$ unitary matrices with sets of two balanced wires comprising crosspoint elements 1 within the chips 3 so that the wiring plates as a whole comprises an $8 \times 8$ matrix.

Then, the wiring plate 4 is entirely dipped into a solder pot, for example. By the dipping, the metalized layer 6 formed on the pedestals 9 and the sealing ceramic sheet 5 is covered with solder. The chip 3 with solder electrodes is superposed on the pedestal and these are together heated so that the chip 3 is facedown-bonded onto the wiring plate.

The connection of the cover 7 is made simultaneously with solder or after the chip bonding.

A green sheet method, for example, may be used for the fabrication of the ceramic wiring plate 4. In the fabrication, a conductive layer of tungsten or molybdenum and an insulating layer of alumina ($Al_2O_3$) are alternately screen-printed on a crude ceramic sheet (green sheet) and then are subjected to firing. The wiring resistance of the conductor with the exposed surface and the resistance of the inner layer conductor covered with alumina becomes different due to oxidation of the conductor and compression of alumina, with great variation of the resistances of the surface conductors in the respective lots. This is undesirable for the speech path switch. Like this example, covering the entire surface except the pedestals with the alumina insulating layer stabilizes the second conductive layer, as in the case of the first conductive layer.

Figure 7:
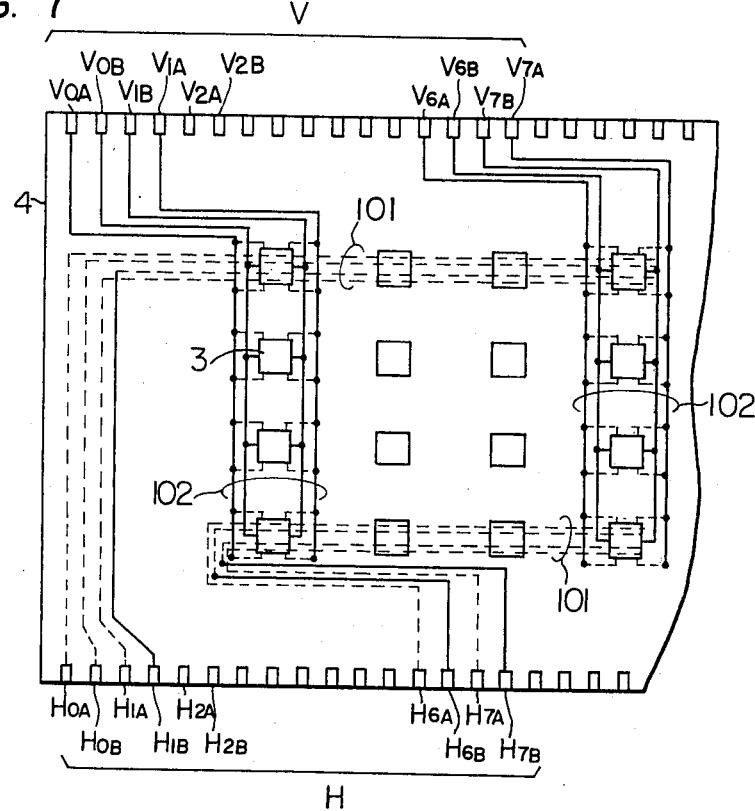
FIG. 7 shows an enlarged view of a peripheral portion in FIG. 2.

Turning now to FIG. 7, there is illustrated connections of H and V lines, and row and column lines on the ceramic wiring plate in FIG. 2. For simplicity, the connections are partially illustrated, with broken lines denoting the first conductive layer and continuous lines indicating the second conductive layer. The h and v lines are omitted. As seen from the figure, the lines A and B of the speech path terminals are disposed in the order of A, B, A, B, . . . for the line H and A, B, B, A, A, B . . . for the line V. Such an arrangement reduces the crosstalk among the wires forming a grid on the wiring plate. In the figure, numerals 101 and 102 designate the lines H and V, respectively.

Figure 8:
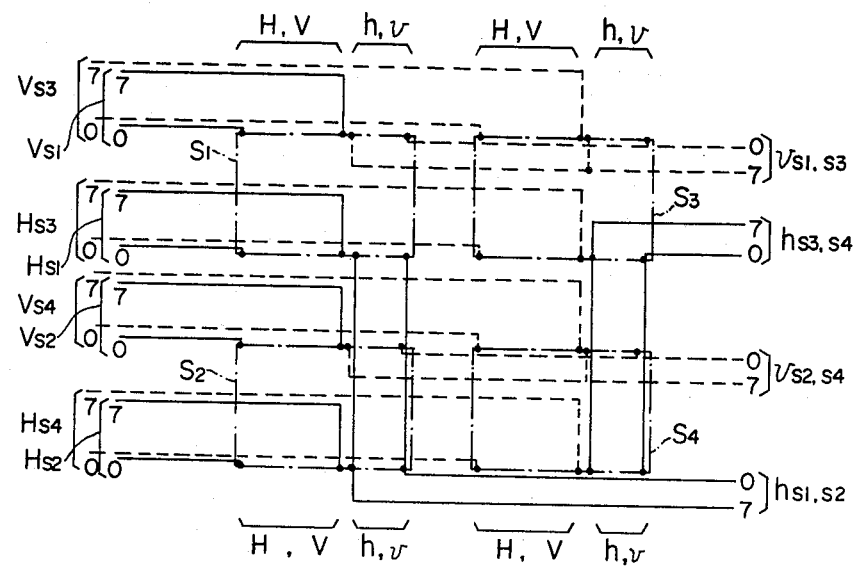
FIG. 8 shows an example of a print wiring of a semiconductor speech path switch of 8×8 matrix construction according to the invention.

An example of wiring on a printed circuit board when the $8 \times 8$ speech path switches constructed in accordance with the invention are mounted on the printed circuit board is shown in FIG. 8. The $8 \times 8$ speech path switches as shown in FIG. 2 are disposed at the locations enclosed by chain line squares S1 to S4. In this example, the lines H and V of the speech path wiring of each switch are individually drawn out and the lines h and v of the selection path wiring are drawn out in common. In FIG. 8, the individual lines are omitted. The wiring is made on both the surfaces of the printed circuit board, the inverse surfaces being drawn by solid lines while the reverse surfaces by broken lines. The line V of a $8 \times 8$ speech path switch S1 denoted as VS1 and the line H denoted as HS1 each consist of 16 lines of the wiring pattern. This is correspondingly applied for the remaining speech path switches.

With respect to the selection path wiring, the lines with the same terminal numbers v of the speech path switches S1 and S3, and S2 and S4 are connected in common. The lines h with the same terminal numbers of the speech path switches S1 and S2, and S3 and S4 are also connected in common. The speech path terminals connecting to the speech path wiring lines H and V of the 8×8 speech path switch are adjacently disposed and located symmetrically at the opposite sides of the ceramic plate. Similarly, the selection path wiring terminals are also disposed symmetrically at the opposite sides of the ceramic plate. Accordingly, terminal h of the speech path switch S1 may pass between the terminals v to connect to the terminal h of the same number of the speech path switch S2. The speech path lines may be wired as a wiring pattern in parallel with terminals arranged in dual-in-line fashion, without passing between the speech path terminals. When the speech path wiring on the printed circuit board is 0.8 mm for pattern width and 1 mm for pattern interval, 16 speech path lines each with about 30 mm may be wired. When the printed circuit board permitting wiring on both the sides is used, any particular consideration is not necessary about the space between opposite terminals of the 8×8 speech path switch and the space between adjacent switches which otherwise must be considered.

If the lines V (VS1, VS3) of the switches S1 and S3 and the lines V (VS2, VS4) of the speech path switches S2 and S4 are connected by the throughhole connection on the printed circuit board, the lines V of two switches are connected in common. The switches thus connected may be used for the concentration stage of a local switch with 16 incoming lines and 8 outgoing lines.

As described above, in the present invention, the wiring of unitary matrices, which are segments of the 8×8 speech path switch, is carried out on the under surface of the ceramic wiring plate chip and around the chip. The lines H and h forming rows of the matrix (or the lines V and v for the column) are formed as a first conductive layer, with the lines V and v for columns (or the lines H and h) which are arranged orthogonally to the lines H and h. Therefore, there is no need for a multilayered wiring on the semiconductor chip. Accordingly, such a construction is economical in the chip manufacturing, and the crosstalk between the lines H and V on the ceramic wiring plate is minimized. Further, the ceramic plate surface, except for the pedestals, is entirely covered with the alumina insulating layer, and the second conductive layer is covered with the ceramic insulating layer, like the first conductive layer. Therefore, the wiring resistance of the second conductive layer is kept low, like the first conductive layer, and is stable against ambient atmosphere.

The respective terminals of the 8×8 matrix are arranged in the so-called dual-in-line fashion. The speech path terminals (lines H and V) are adjacently disposed to each other. The selection path terminals (the lines h and v) are also arranged similarly. Those terminals are oppositely located at the symmetrical positions on the opposite sides of the ceramic wiring plate. Accordingly, when a grid plate with a plurality of 8×8 switches on the printed circuit board is constructed, it is necessary to pass the speech path wiring between the speech path terminals and the selection terminals may be wired passing between the selection terminals on the printed circuit board. This facilitates the grid board wiring. Further, the lines A and B of the speech path terminals are disposed in the order of A, B, A, B, . . . for the line H terminals (or the line V terminals) and in the order of A, B, B, A, A, B, B, A, . . . for the line V terminals (or line H terminals). The disposition of those lines minimizes the crosstalk among the wiring on the printed circuit board constituting the grid.

The terminal arrangement shown above is a mere example. As an alternative, the respective terminals H, V, h, v can be divided into two groups and these groups can be disposed at the opposite sides. Besides ceramic material, the material for the wiring plate may be silicon, polyimide and the like.

What is claimed is:

1. A semiconductor speech path switch comprising a plurality of semiconductor chips each including a cross-point element formed in said chips, first electrode means for forming a speech path connected with said cross-point element, and second electrode means for selectively actuating said cross-point element, and wiring plate means including pedestals respectively connected with the first and second electrode means on said chips, a group of terminals disposed on said wiring plate means, and a group of wirings for connecting said group of terminals with said group of pedestals, said plural chips being mounted on said wiring plate means by facedown bonding, thereby to form a matrix array, wherein the improvement comprises said group of wirings comprising a first group of speech path wirings and selection path wirings constituting rows of said matrix array, and a second group of speech path wirings and selection path wirings constituting columns of said matrix array, said first group of speech and selection path wirings forming a first layer and said second group of speech and selection path wirings forming a second layer separated from said first layer by an insulating layer, said first and second group of speech and selection path wirings intersecting to each other through said insulating layer, said first group of speech and selection path wirings being connected with said pedestals through through-holes in said insulating layer and said second group of speech and selection path wirings being connected directly with said pedestals; and wherein said improvement further comprises said group of terminals including a first group of speech path terminals and selection terminals constituting rows of said speech path, and a second group of speech path terminals and selection terminals constituting columns of said speech path, said first and second group of terminals being disposed adjacent to each other on said wiring plate means.

2. A semiconductor speech path switch according to claim 1, wherein said first group of speech path terminals and selection terminals are disposed in one side of said wiring plate means, and wherein said second group of speech path terminals and selection terminals are disposed at a position opposite to said first group of speech path terminals and selection terminals along another side of said wiring plate means.

3. A semiconductor speech path switch according to claim 1 or 2, wherein each of said cross-point elements comprises first and second switching elements, and further wherein said first group of speech path terminals and said second group of speech path terminals comprise a plurality of pairs of A-line terminals for coupling to said first switching elements and B-line terminals for coupling to said second switching elements, and wherein one of said first and second group of terminals is disposed in a train of terminals, A, B, A, B, A, B, A, B and the other group is disposed in a train of terminals A, B, B, A, A, B, B, A.

* * * * *